US011699501B2

(12) United States Patent
Oh

(10) Patent No.: US 11,699,501 B2
(45) Date of Patent: Jul. 11, 2023

(54) SEMICONDUCTOR MEMORY DEVICE AND PARTIAL RESCUE METHOD THEREOF

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/751,448

(22) Filed: May 23, 2022

(65) Prior Publication Data

US 2022/0284981 A1 Sep. 8, 2022

Related U.S. Application Data

(62) Division of application No. 17/204,363, filed on Mar. 17, 2021, now Pat. No. 11,367,504.

(30) Foreign Application Priority Data

Nov. 6, 2020 (KR) .................. 10-2020-0147595

(51) Int. Cl.
*G11C 29/44* (2006.01)
*G11C 29/18* (2006.01)
*G11C 29/36* (2006.01)
*G11C 29/46* (2006.01)

(52) U.S. Cl.
CPC .............. *G11C 29/44* (2013.01); *G11C 29/18* (2013.01); *G11C 29/36* (2013.01); *G11C 29/46* (2013.01)

(58) Field of Classification Search
CPC ......... G11C 29/44; G11C 29/18; G11C 29/36; G11C 29/46
See application file for complete search history.

(56) References Cited

U.S. PATENT DOCUMENTS

| 2003/0167372 | A1 | 9/2003 | Lee |
| 2008/0266956 | A1 | 10/2008 | Bye On |
| 2009/0040827 | A1 | 2/2009 | Kim |
| 2017/0123994 | A1 | 5/2017 | Pandya |
| 2019/0115052 | A1* | 4/2019 | Seong ............... G11C 5/04 |
| 2020/0357448 | A1 | 11/2020 | Yip |

FOREIGN PATENT DOCUMENTS

| KR | 1020120126364 A | 11/2012 |
| KR | 1020170045554 A | 4/2017 |

* cited by examiner

*Primary Examiner* — Han Yang

(57) ABSTRACT

A semiconductor memory device includes a plurality of planes defined in a plurality of chip regions; and a rescue circuit configured to disable a failed plane and enable a normal plane from among the plurality of planes, wherein the semiconductor memory device operates with only normal planes that are enabled.

9 Claims, 14 Drawing Sheets

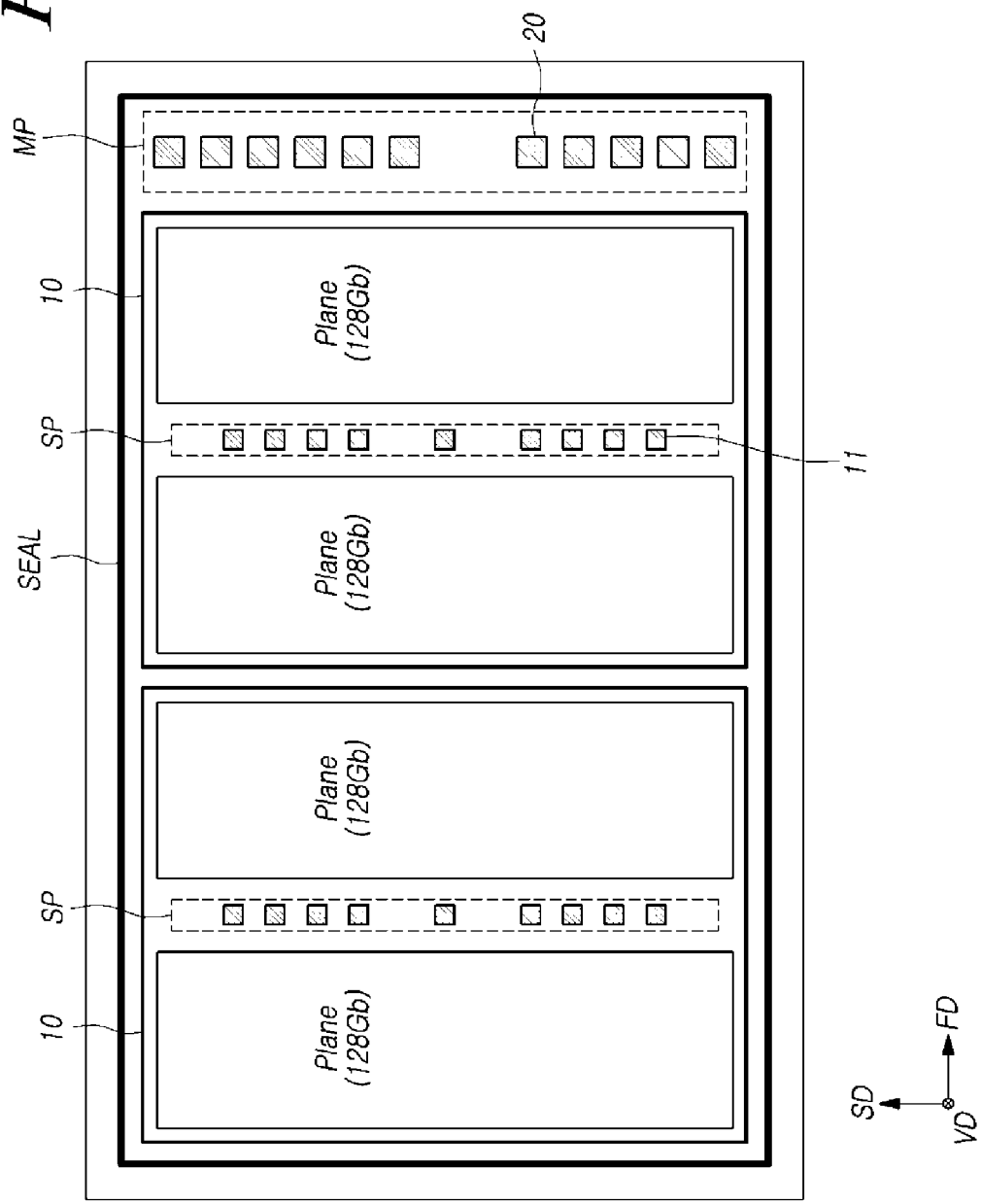

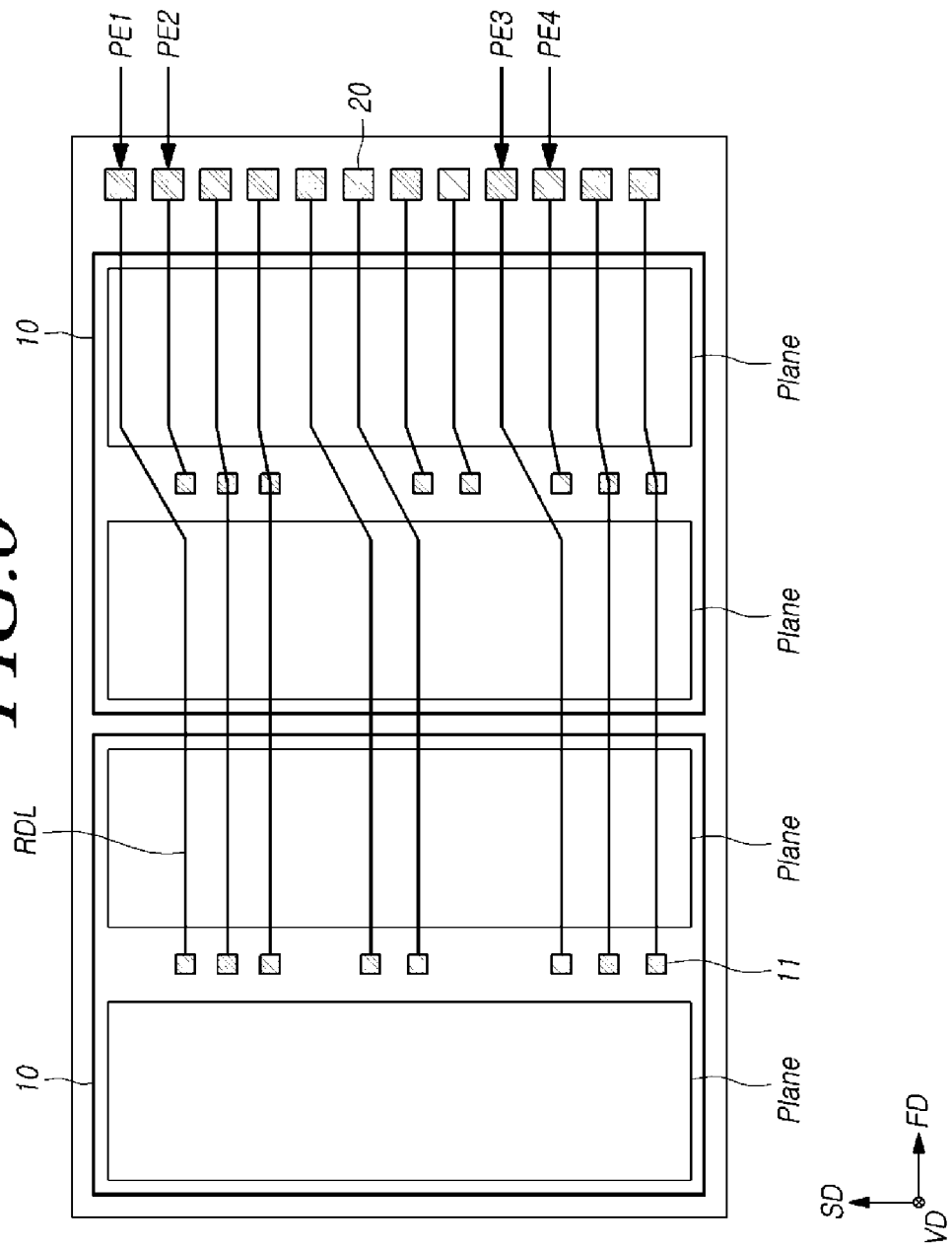

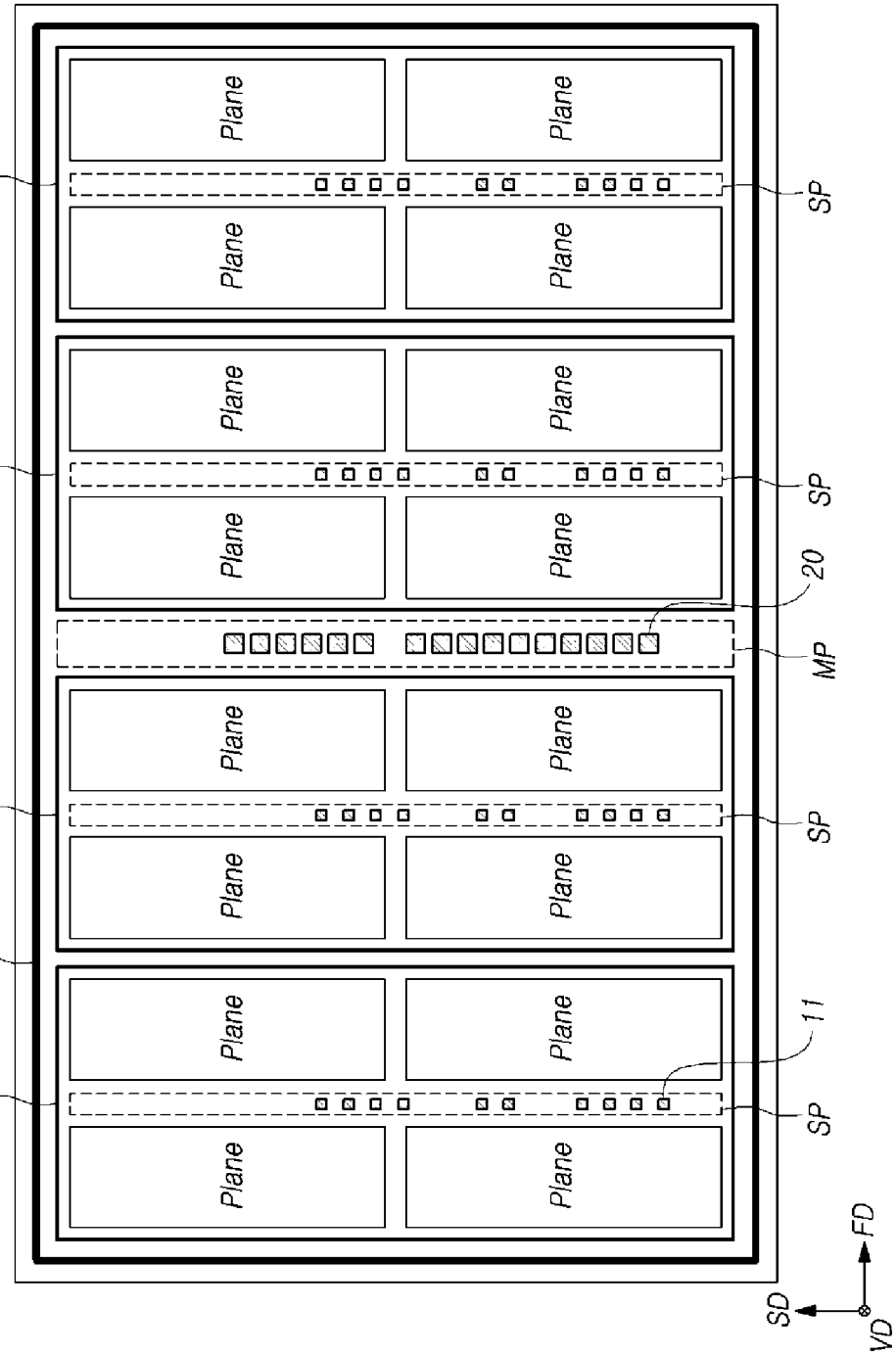

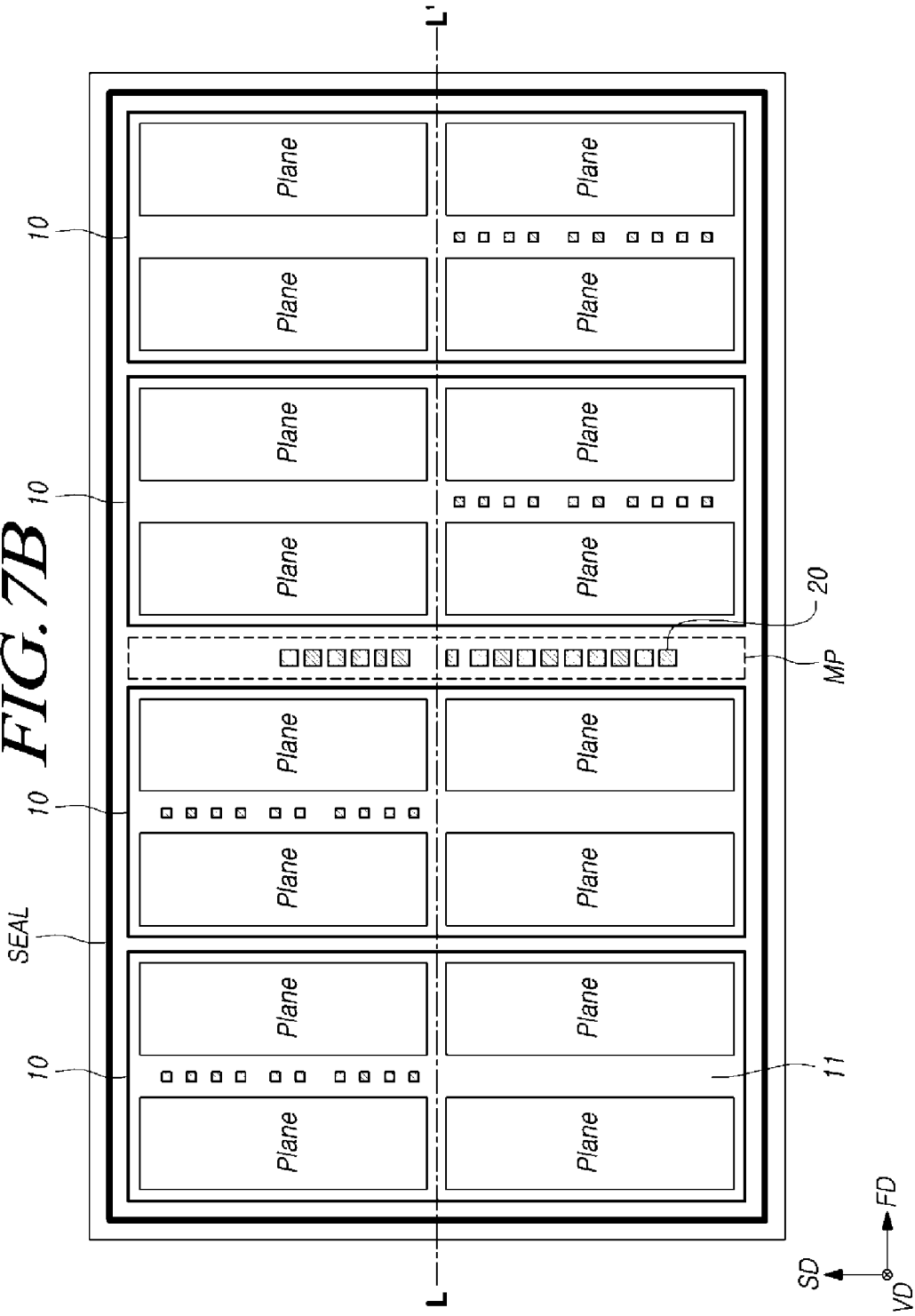

SEMICONDUCTOR MEMORY DEVICE AND PARTIAL RESCUE METHOD THEREOF

CROSS-REFERENCE TO RELATED APPLICATION

The present application is a divisional application of a U.S. patent application Ser. No. 17/204,363, filed on Mar. 17, 2021, which claims priority under 35 U.S.C. § 119(a) to Korean Patent Application No. 10-2020-0147595 filed in the Korean Intellectual Property Office on Nov. 6, 2020, which is incorporated herein by reference in its entirety.

BACKGROUND

1. Technical Field

Various embodiments generally relate to a semiconductor technology, and, more particularly, to a semiconductor memory device and a partial rescue method thereof.

2. Related Art

A semiconductor memory device is a memory device which is realized using a semiconductor such as silicon (Si), germanium (Ge), gallium arsenide (GaAs) and indium phosphide (InP). A semiconductor memory device is generally classified into a volatile memory device and a nonvolatile memory device.

A volatile memory device is a memory device that loses data stored therein when power supply is interrupted. Examples of a volatile memory device include an SRAM (static RAM), a DRAM (dynamic RAM) and an SDRAM (synchronous DRAM). A nonvolatile memory device is a memory device that retains data stored therein even when power supply is interrupted. Examples of a nonvolatile memory device include a ROM (read only memory), a PROM (programmable ROM), an EPROM (electrically programmable ROM), an EEPROM (electrically erasable and programmable ROM), a flash memory, a PRAM (phase change RAM), an MRAM (magnetic RAM), an RRAM (resistive RAM), and an FRAM (ferroelectric RAM).

Examples of devices that use a nonvolatile memory include an MP3 player, a digital camera, a mobile phone, a camcorder, a flash card and a solid state disk (SSD). As devices that use a nonvolatile memory as a storage device increase, the capacity of the nonvolatile memory is rapidly increasing.

SUMMARY

Various embodiments are directed to a semiconductor memory device and a partial rescue method thereof capable of improving manufacturing yield.

In an embodiment, a semiconductor memory device may include: a plurality of planes defined in a plurality of chip regions; and a rescue circuit configured to disable a failed plane and enable a normal plane from among the plurality of planes, wherein the semiconductor memory device operates with only normal planes that are enabled.

In an embodiment, a rescue method of a semiconductor memory device including a plurality of planes may include: obtaining a status signal, for each of the plurality of planes, indicating whether a failure exists or not in each of the plurality of planes by individually testing each of the plurality of planes for a failure; and controlling whether each of the plurality of planes is enabled based on the status signal for each of the plurality of planes, such that a failed plane is disabled and a normal plane is enabled.

In an embodiment, a layout of a semiconductor memory device comprising: a plurality of chip regions each including a plurality of planes arranged in a first direction; a main pad region extending in a second direction perpendicular to the first direction and including a plurality of main pads arranged in the second direction; a plurality of sub pad regions, each extending in the second direction and including a plurality of sub pads arranged in the second direction; wherein each of the plurality of planes corresponds to one of the plurality of main pads; wherein each of the plurality of planes is directly connected to at least one of the plurality of sub pads, which is connected to the corresponding one of the main pads through a redistribution line; and wherein a width of the main pad region in the first direction is greater than a width of the sub pad region in the first direction.

BRIEF DESCRIPTION OF THE DRAWINGS

FIG. 5 is a top view illustrating the layout of a semiconductor memory device in accordance with an embodiment of the disclosure.

FIG. 6 is an exemplary top view illustrating redistribution lines which couple main pads and sub pads of FIG. 5.

FIGS. 7A to 7C are top views illustrating semiconductor memory devices in accordance with other embodiments of the disclosure.

Figure 9:
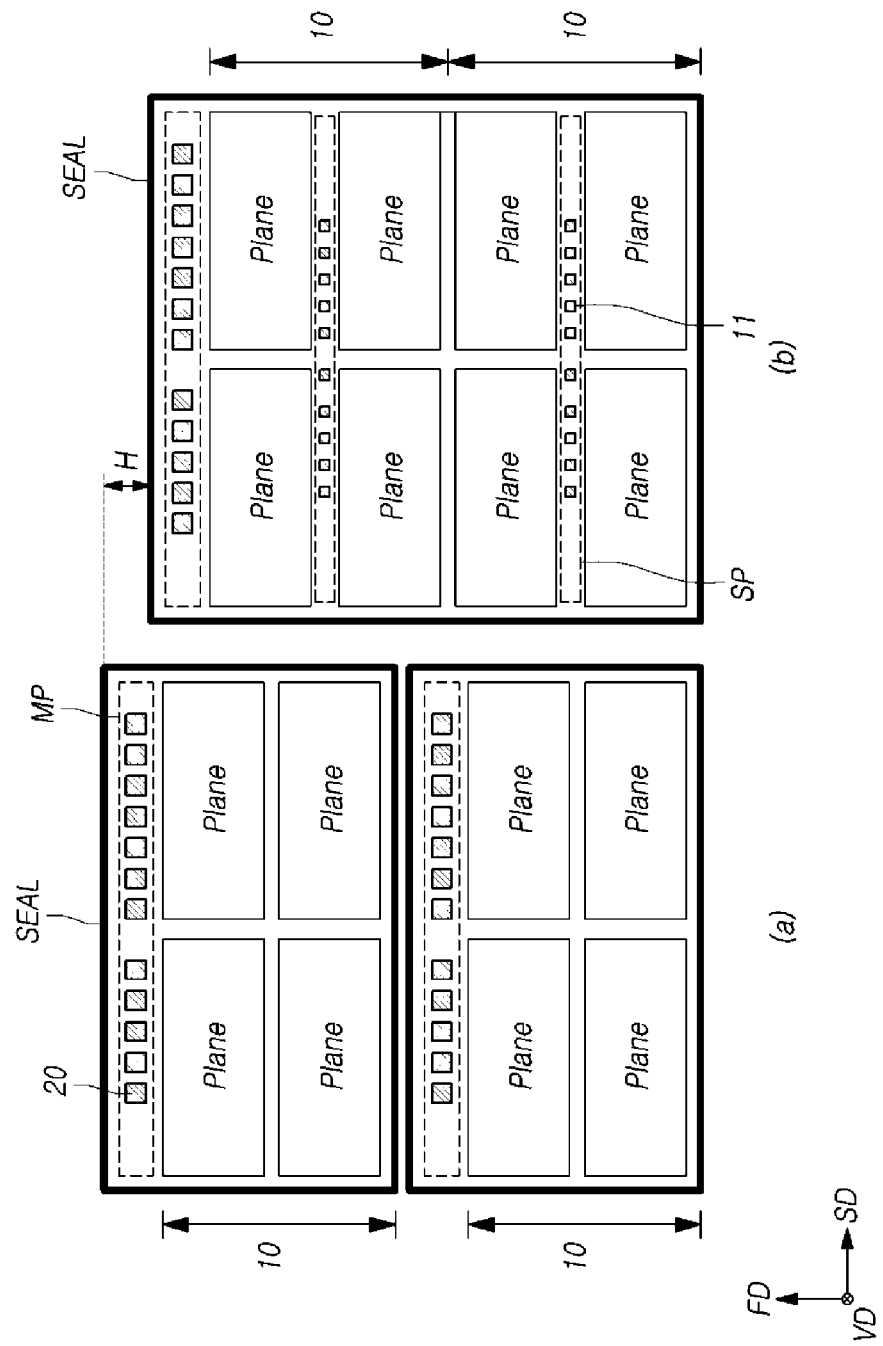

Part (a) of FIG. 9 is an exemplary top view illustrating a semiconductor memory device that is different from the embodiments of the disclosure, and part (b) of FIG. 9 is an exemplary top view illustrating a semiconductor memory device in accordance with an embodiment of the disclosure.

Figure 10:
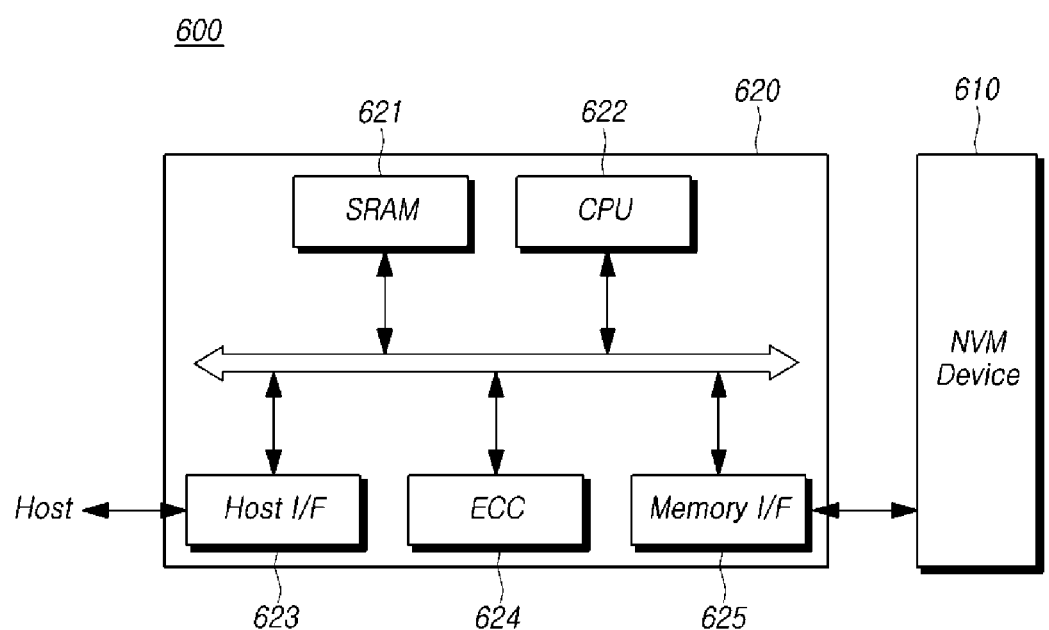

FIG. 10 is a block diagram schematically illustrating a memory system including a semiconductor memory device in accordance with an embodiment of the disclosure.

Figure 11:
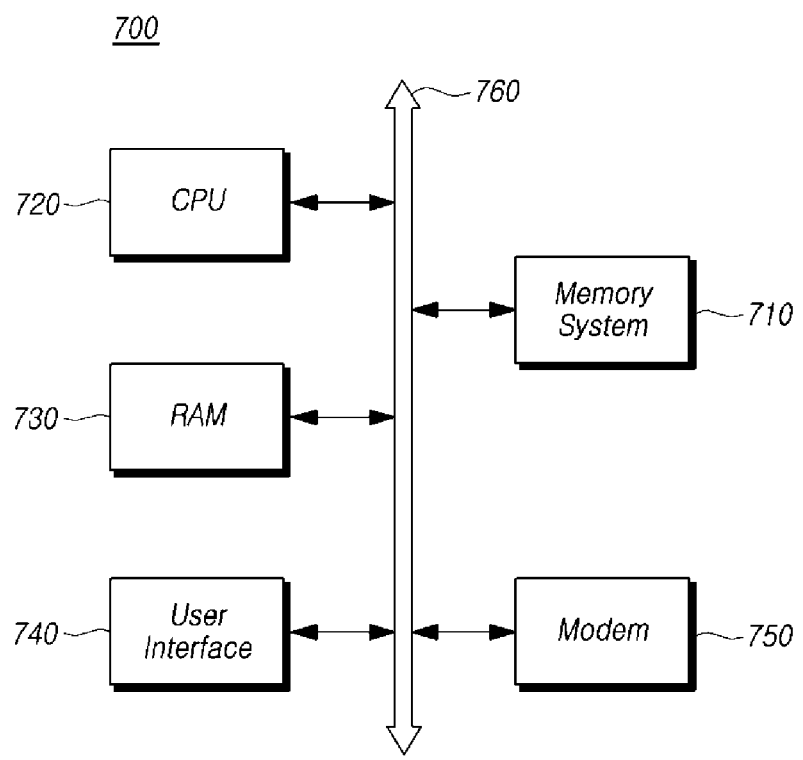

FIG. 11 is a block diagram schematically illustrating a computing system including a semiconductor memory device in accordance with an embodiment of the disclosure.

DETAILED DESCRIPTION

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

Figure 1:
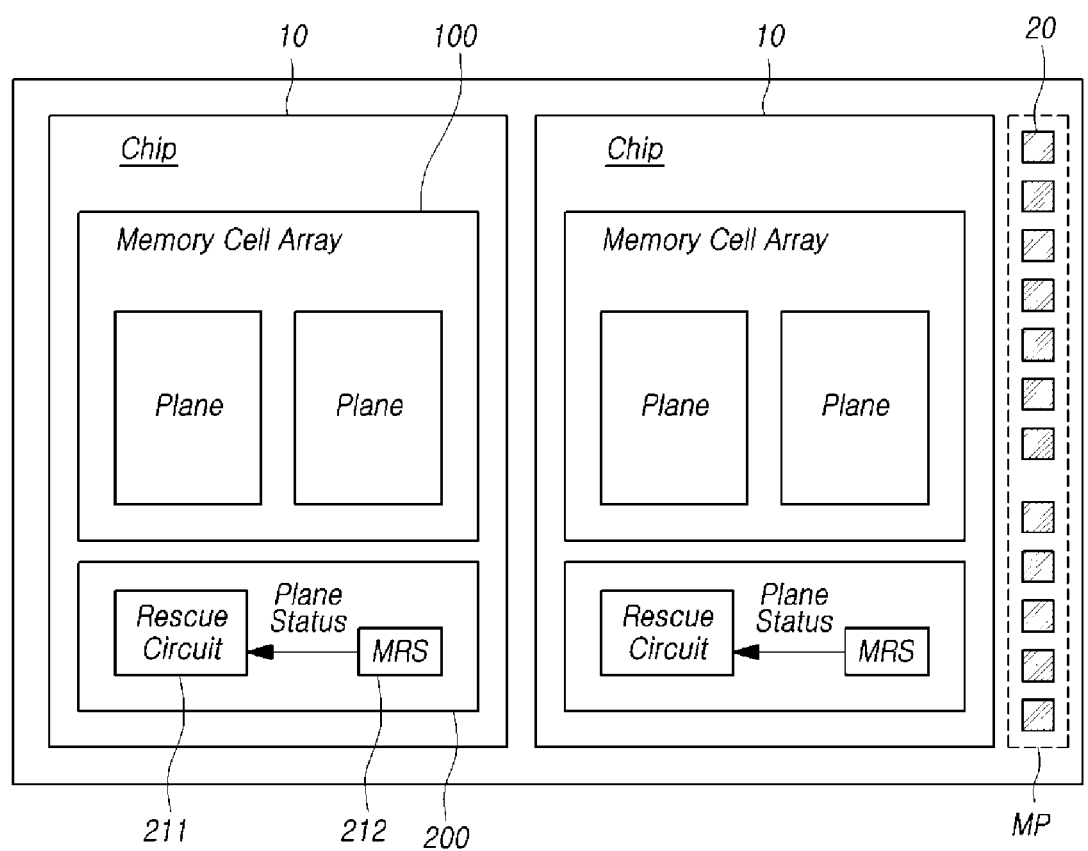
FIG. 1 is a block diagram schematically illustrating a semiconductor memory device in accordance with an embodiment of the disclosure.

FIG. 1 is a block diagram schematically illustrating a semiconductor memory device in accordance with an embodiment of the disclosure.

Referring to FIG. 1, a semiconductor memory device in accordance with an embodiment of the disclosure may include a plurality of planes (Plane), which are defined in a plurality of chip regions (Chip) 10, and rescue circuits 211, which disable a failed plane and enable a normal plane, among the plurality of planes (Plane).

In more detail, the semiconductor memory device may include a plurality of chip regions 10 and a main pad region MP. Although FIG. 1 illustrates two chip regions 10 included in the semiconductor memory device, this is for illustration purposes only, and the number of chip regions 10 in embodiments of the disclosure may be three or more.

Each of the plurality of chip regions 10 may include a memory cell array (Memory Cell Array) 100 and a control circuit 200. The memory cell array 100 may include a plurality of planes (Plane), and the control circuit 200 may include the rescue circuit (Rescue Circuit) 211 and a plane status storage unit (MRS) 212. Although FIG. 1 illustrates two planes (Plane) included in one chip region 10, this is for illustration purposes only, and the number of planes (Plane) included in one chip region 10 may be one or at least three in embodiments of the disclosure.

Although not illustrated, each plane (Plane) may include a plurality of memory blocks. As will be described later with reference to FIG. 3, each memory block may include a plurality of memory cells and a plurality of select transistors. The memory cells may be coupled to word lines, and each of the select transistors may be coupled to one of a drain select line and a source select line. Each memory cell may store one bit or at least two bits. The plurality of memory cells may form a three-dimensional structure by being stacked in a direction perpendicular to a surface of a substrate.

Hereinafter, descriptions will be made for a case in which a memory cell of the device is a flash memory cell, but it is to be noted that the disclosure is not limited thereto. In other embodiments, the memory cell may be a resistive memory cell such as a resistive RAM (ReRAM), a phase change RAM (PRAM) or a magnetic RAM (MRAM).

A plurality of main pads 20 may be disposed in the main pad region MP. The semiconductor memory device may interface with an external device through the plurality of main pads 20. As will be described later with reference to FIG. 6, the plurality of main pads 20 may include plane enable pads. The plane enable pads may correspond to the planes (Plane), respectively, and a plane enable signal for enabling a corresponding plane (Plane) may be inputted to each plane enable pad.

The plurality of planes (Plane) included in the semiconductor memory device may be independently enabled or disabled under the control of the rescue circuits 211.

After the semiconductor memory device is manufactured, the plurality of planes (Plane) included in the semiconductor memory device may be individually tested to check whether a failure exists or not.

In a test mode, the rescue circuit 211 may individually enable a plane (Plane) in response to a plane enable signal inputted through a plane enable pad. Thus, each of the plurality of planes (Plane) may be independently tested for the presence or absence of a failure.

In a test, by writing data in a test target plane (Plane) and reading the written data, the existence or absence of a failure in the plane (Plane) may be monitored. Alternatively, whether a failure exists or not in the plane (Plane) may also be monitored by checking the lifetimes of the memory cells included in a test target plane (Plane). In the disclosure, no particular test method is prescribed, and any suitable test method may be utilized as long as the test method is capable of checking whether a failure exists or not in a plane. A test may be performed by an external device such as a controller or test equipment.

The plane status storage unit 212 may store a test result, that is, a status signal (hereinafter, referred to as a 'status signal (Plane Status) for each plane') indicating whether a failure exists or not in each of the plurality of planes (Plane).

The status signal (Plane Status) may be, for example, 1-bit binary data. When a plane (Plane) is in a normal state, the status signal (Plane Status) of the corresponding plane may be set to a logic '1,' and, when a plane (Plane) is in a failed state, the status signal (Plane Status) of the corresponding plane may be set to a logic '0.' The normal state means a state in which there is no failure or in which there is a partial failure, but repair is possible. The failed state means a state in which a fatal failure has occurred and repair is impossible.

The rescue circuit 211 may control whether to enable each plane (Plane), based on the status signal (Plane Status) for each plane stored in the plane status storage unit 212. When a specific plane (Plane) is requested to be accessed by a command of an external system, the rescue circuit 211 may determine whether to enable the plane (Plane). For example, the rescue circuit 211 may determine whether a failure exists or not in a plane (Plane) to be accessed, based on the status signal (Plane Status) for the corresponding plane. If the status signal (Plane Status) of the plane (Plane) to be accessed is the logic '1,' then the corresponding plane (Plane) is in a normal state and may be enabled. If the status signal (Plane Status) of the plane (Plane) to be accessed is the logic '0,' then the corresponding plane (Plane) is in a failed state, and the corresponding plane (Plane) may be disabled, and a different plane (Plane) in a normal state may be enabled.

Figure 2:
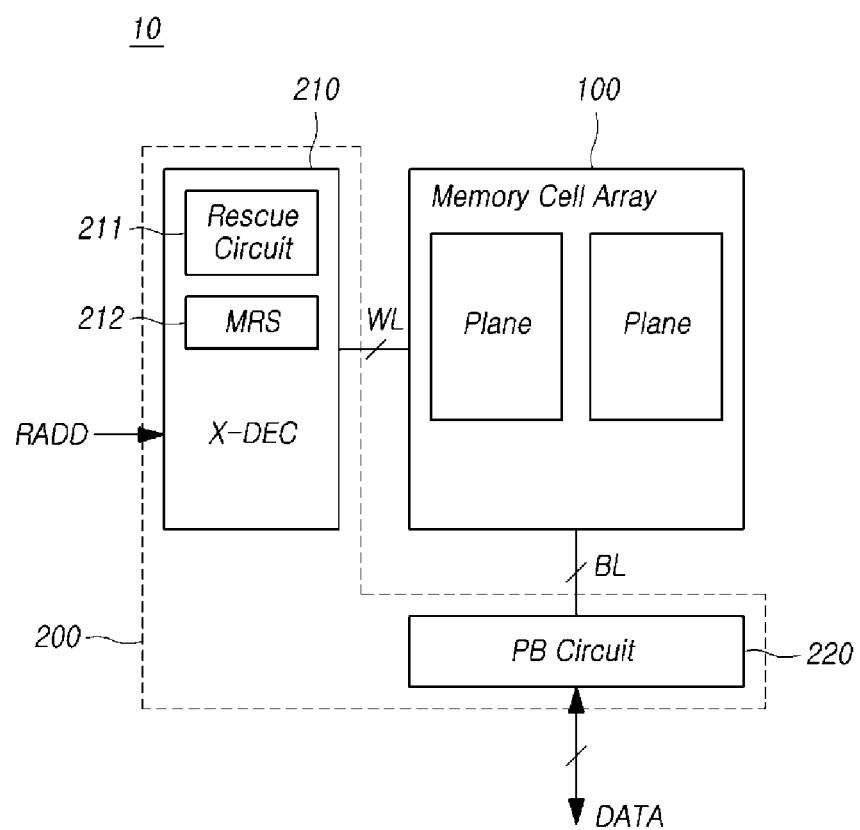
FIG. 2 is an exemplary block diagram illustrating one chip region included in FIG. 1.

FIG. 2 is an exemplary block diagram illustrating one chip region included in FIG. 1.

Referring to FIG. 2, the chip region 10 may include the memory cell array 100 and the control circuit 200.

As described above with reference to FIG. 1, the memory cell array 100 may include a plurality of planes (Plane), and each plane (Plane) may include a plurality of memory blocks.

The memory blocks may be coupled to a row decoder 210 through word lines WL, and may be coupled to a page buffer circuit 220 through bit lines BL. The memory block will be described later with reference to FIG. 3.

The control circuit 200 may include the row decoder 210 and the page buffer circuit 220.

The row decoder 210 may select a plane (Plane) to be accessed, in response to a row address RADD, and may select any one from among the memory blocks included in the selected plane (Plane). The row decoder 210 may transfer an operating voltage to word lines WL that are coupled to the selected memory block.

The rescue circuit 211 and the plane status storage unit 212 may be included in the row decoder 210. However, this is for an illustration purpose only, and the rescue circuit 211 and the plane status storage unit 212 may be provided separately from the row decoder 210.

The rescue circuit 211 may control the planes (Plane), based on the status signal (Plane Status) for each plane stored in the plane status storage unit 212, such that the planes (Plane) can be independently enabled or disabled.

In this way, through a configuration in which the planes (Plane) are controlled such that they can be independently enabled or disabled. Thus, if a certain plane has a failure, then that plane is disabled to prevent a failed plane from being used, and thereby, a partially rescued semiconductor memory device that operates with only remaining normal planes may be configured.

The page buffer circuit 220 may include a plurality of page buffers that are coupled to the bit lines BL, respectively. A page buffer may be coupled to the memory cell array 100 through a bit line BL, and may detect data stored in a memory cell of the memory cell array 100 by sensing a signal of the bit line BL. The page buffer may apply a signal to the bit line BL based on a data signal DATA received therein, and accordingly, may write data to the memory cell of the memory cell array 100.

Figure 3:
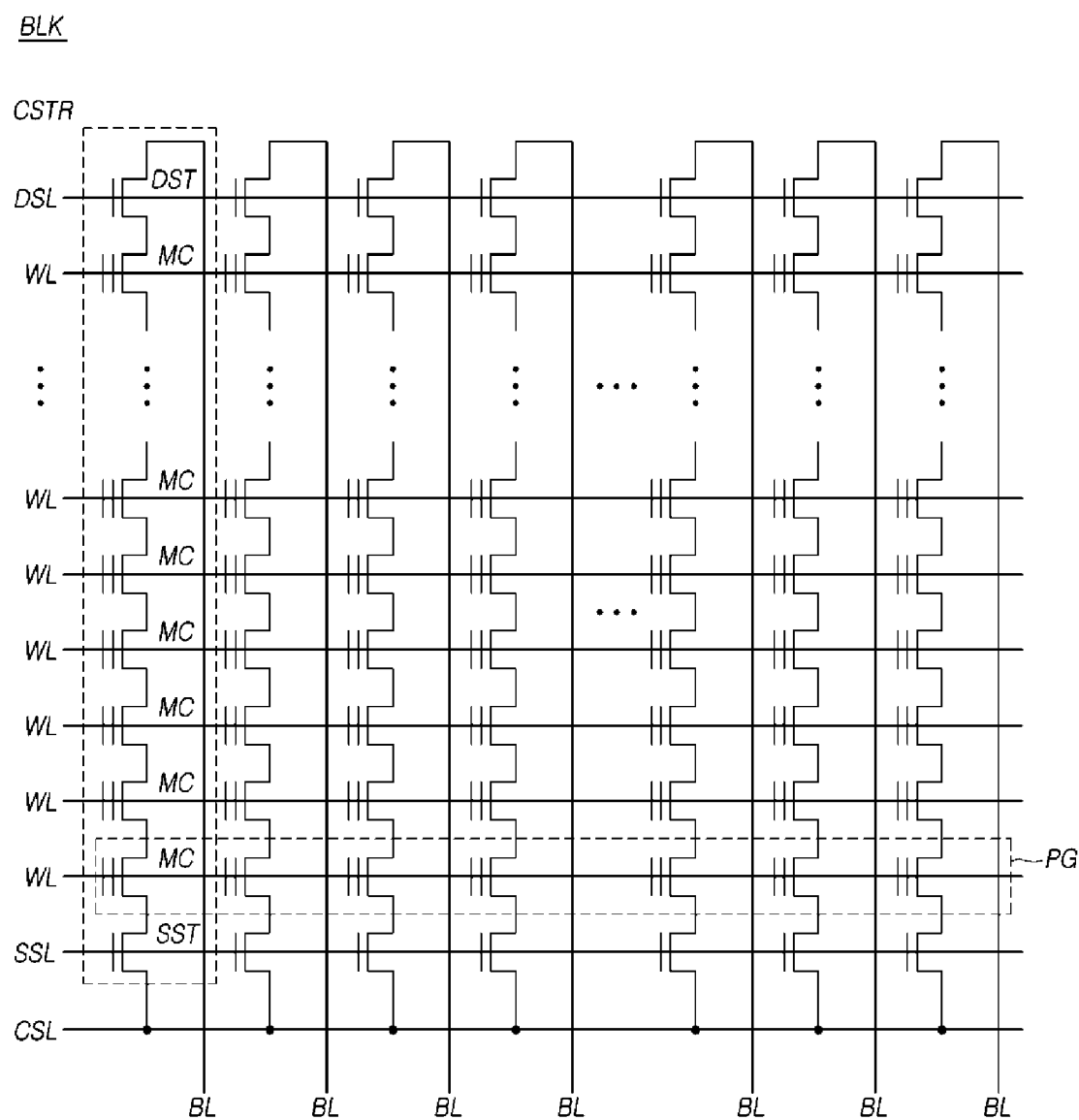
FIG. 3 is an equivalent circuit diagram of a memory block included in a semiconductor memory device in accordance with an embodiment of the disclosure.

FIG. 3 is an equivalent circuit diagram of a memory block included in a semiconductor memory device in accordance with an embodiment of the disclosure.

Referring to FIG. 3, a memory block BLK may include a plurality of cell strings CSTR, which are coupled between a plurality of bit lines BL and a common source line CSL.

Each of the cell strings CSTR may be coupled between a corresponding bit line BL and the common source line CSL. Each of the cell strings CSTR may include a source select transistor SST, which is coupled to the common source line CSL, a drain select transistor DST, which is coupled to the bit line BL, and a plurality of memory cells MC, which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed in a direction perpendicular to the bit lines BL. The source select line SSL, the word lines WL and the drain select line DSL may form a three-dimensional structure by being stacked over the surface of the substrate in a vertical direction.

Memory cells MC included in the memory block BLK may be divided into physical page units or logical page units. For example, memory cells MC that share one word line WL and are coupled to different cell strings CSTR may configure one physical page PG. Such a page may be the basic unit of a read operation.

For instance, FIG. 3 illustrates that one drain select transistor DST and one source select transistor SST are provided in each of the cell strings CSTR. However, it is to be noted that at least two drain select transistors or at least two source select transistors may be provided in each of the cell strings CSTR.

Figure 4A:
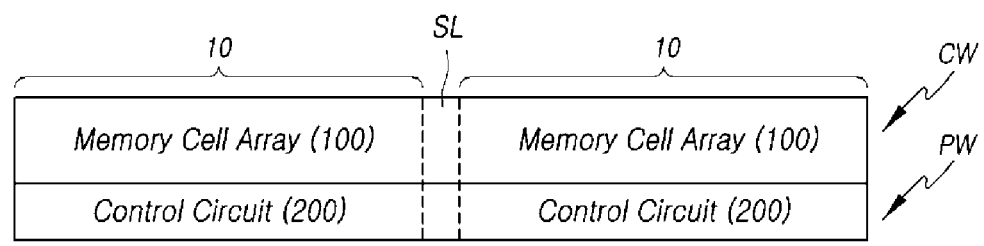
FIGS. 4A and 4B are exemplary cross-sectional views illustrating semiconductor memory devices in accordance with embodiments of the disclosure.
Figure 4B:
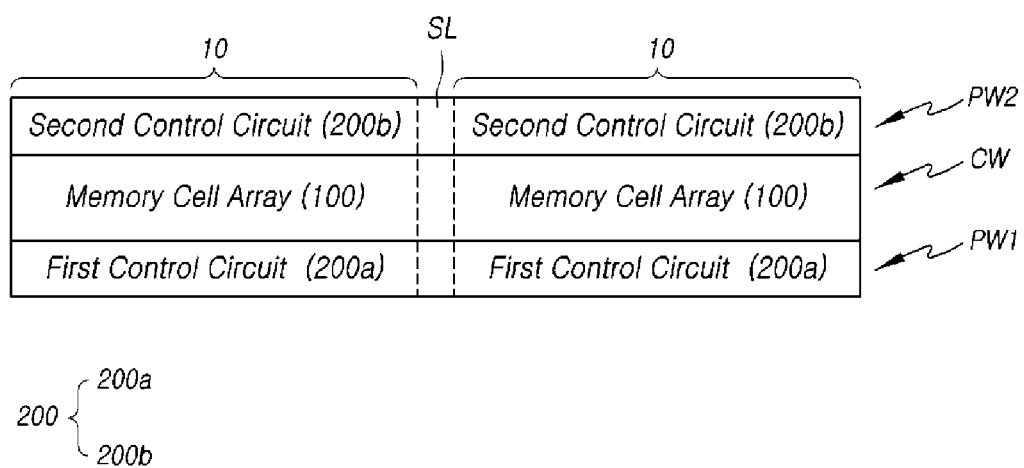

FIGS. 4A and 4B are exemplary cross-sectional views illustrating semiconductor memory devices in accordance with embodiments of the disclosure.

Referring to FIG. 4A, in an embodiment, a semiconductor memory device may include a peripheral wafer PW and a cell wafer CW that is bonded onto the peripheral wafer PW. Memory cell arrays 100 may be disposed in the cell wafer CW, and control circuits 200 may be disposed in the peripheral wafer PW.

Chip regions 10 of the semiconductor memory device may be coupled to each other by a scribe lane SL. Each chip region 10 may include the memory cell array 100 and the control circuit 200, which are disposed to overlap up and down in a vertical direction.

In another embodiment, as illustrated in FIG. 4B, a semiconductor memory device may include a cell wafer CW, a first peripheral wafer PW1 and a second peripheral wafer PW2. Each control circuit 200 may be divided into a first circuit part 200a and a second circuit part 200b. The first circuit parts 200a of the control circuits 200 may be disposed in the first peripheral wafer PW1, and the second circuit parts 200b of the control circuits 200 may be disposed in the second peripheral wafer PW2.

Although FIG. 4B illustrates a cell wafer CW bonded onto a first peripheral wafer PW1 and a second peripheral wafer PW2, this is for illustration purposes only. As another example, a first peripheral wafer may be bonded onto a cell wafer, and a second peripheral wafer may be bonded onto the first peripheral wafer.

As illustrated in FIGS. 4A and 4B, if the memory cell arrays 100 and the control circuits 200 are fabricated on separate wafers, then the memory cell arrays 100 will not be influenced by manufacturing processes of the control circuits 200, and the control circuits 200 will not be influenced by manufacturing processes of the memory cell arrays 100. Accordingly, when selecting materials used in the fabrication of the memory cell arrays 100 and the control circuits 200, the range of choice becomes wider, and it is possible to select materials in consideration of performance and costs, which is advantageous to improve performance and to reduce costs.

A stack package technology is known, in which a plurality of semiconductor memory devices are vertically stacked to form one package. Semiconductor memory devices that have a structure in which a plurality of wafers are bonded and each have a substantial thickness, so it may be difficult to fabricate a high-capacity package to a thickness equal to or less than that required in a specification. According to the embodiments of the disclosure, however, chip regions 10 included in the semiconductor memory device are horizontally coupled through the scribe lane SL. Therefore, even when the height of a package is lowered by reducing the number of semiconductor memory devices to be stacked, it is possible to realize a high-capacity package, such as in examples illustrated in FIGS. 4A and 4B.

FIG. 5 is a top view illustrating a layout of a semiconductor memory device in accordance with an embodiment of the disclosure, and FIG. 6 is an exemplary top view illustrating redistribution lines that couple main pads and sub pads of FIG. 5. For the sake of simplicity in illustration, illustration of a sealing region is omitted in FIG. 6.

Referring to FIG. 5, a sealing region SEAL may be formed at edges of a semiconductor memory device. A plurality of chip regions 10 and a main pad region MP may be disposed in a region surrounded by the sealing region SEAL. The sealing region SEAL may be disposed to surround, as integral parts, the plurality of chip regions 10 and the main pad region MP, and may serve to protect the plurality of chip regions 10 and the main pad region MP.

A semiconductor memory device may be fabricated at a wafer level, and may be individualized through a wafer cutting process after being completely fabricated. A crack may occur when a wafer is cut. The crack may proceed from an edge to an inside of the semiconductor memory device. The sealing region SEAL may serve to suppress or stop the crack from proceeding and thereby prevent the chip regions 10 and the main pad region MP from being damaged by the crack. In addition, the sealing region SEAL may serve to block the penetration of moisture and thereby prevent the chip regions 10 from being damaged by moisture.

The plurality of chip regions 10 and the main pad region MP may be disposed or arranged in a first direction FD within an internal region surrounded by the sealing region SEAL.

For example, the main pad region MP may be disposed at an edge of the internal region so as to have a shape extending in a second direction SD. In the main pad region MP, a plurality of main pads 20 may be arranged in the second direction SD, which may be an extending direction of the main pad region MP. Although not illustrated, an external coupling member such as a bump or a wire may be bonded to each main pad 20. That is to say, the main pad 20 is a bonding pad to which the external coupling member is bonded. In order to allow the external coupling member to be bonded thereto, the main pad 20 has a minimum predetermined size.

Each of the plurality of chip regions 10 may include a plurality of planes (Plane) and a sub pad region SP, which is disposed parallel to the plurality of planes (Plane). The plurality of planes (Plane) and the sub pad region SP may be disposed in the first direction FD, and the sub pad region SP may be configured to have a shape extending in the second direction SD. In the sub pad region SP, a plurality of sub pads 11 may be arranged in the second direction SD, which may be the extending direction of the sub pad region SP. Each of the sub pads 11 may be coupled to a corresponding main pad 20 through a redistribution line to be described below with reference to FIG. 6, and therefore may be coupled to an external device through the corresponding main pad 20.

The sub pad 11 is a non-bonding pad to which no external coupling member is bonded, and may have a size smaller than the main pad 20. Unlike the main pad 20, which is bonded to an external coupling member such as a bump or a wire, the sub pad 11 may be configured to a size smaller than the main pad 20 because no external coupling member is bonded to the sub pad 11.

A width of the sub pad region SP in the first direction FD may be smaller than a width of the main pad region MP in the first direction FD. A sub pad 11 may have a width in the first direction FD that is smaller than a width of a main pad 20 in the first direction FD, which allows the sub pad region SP used for disposing the sub pads 11 to be configured to a width smaller than the width, in the first direction FD, of the main pad region MP used for disposing the main pads 20.

Referring to FIG. 6, each of the sub pads 11 may be coupled to a corresponding main pad 20 through a redistribution line RDL.

The main pads 20 may include a plurality of plane enable pads. The plane enable pads may correspond to the planes (Plane), respectively, included in the semiconductor memory device, and a plane enable signal for enabling a corresponding plane (Plane) may be inputted to each plane enable pad. The plane enable pads may be provided in the same number as the number of the planes (Plane) included in the semiconductor memory device. FIG. 6 illustrates a structure including four planes (Plane). In this case, four of the main pads 20 may be allocated as plane enable pads for inputting plane enable signals PE1 to PE4.

The other main pads 20, except for the plane enable pads, may include a power pad (Vcc), a ground pad (Vss), control pads (nCE, CLE, ALE, nWE, etc.) and data pads (DQ0 to DQ7), for example. Because these pads are well known in the art, detailed descriptions of such pads will be omitted.

Figure 7C:
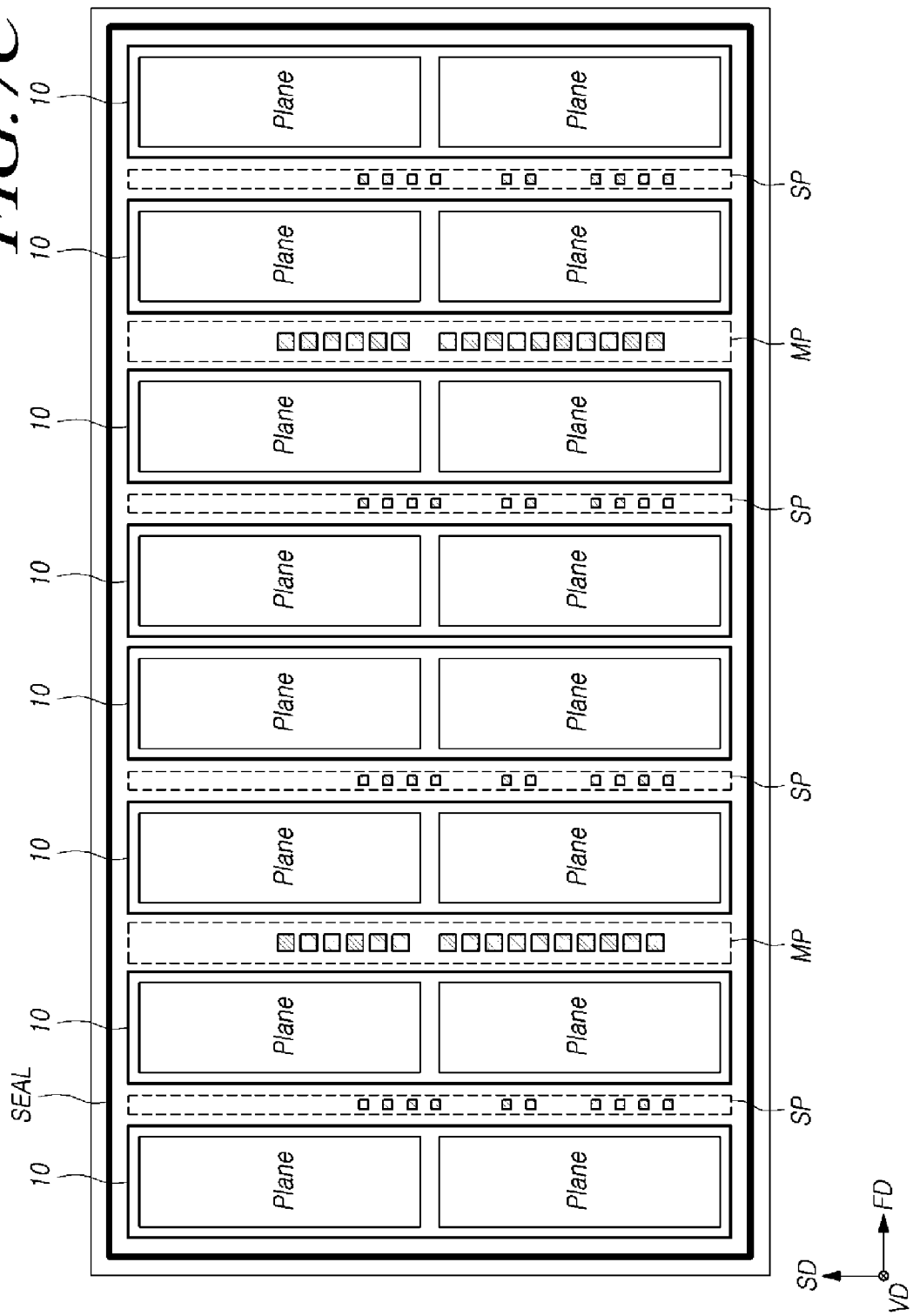

FIGS. 7A to 7C are top views illustrating semiconductor memory devices in accordance with other embodiments of the disclosure. For the sake of simplicity in illustration, illustration of redistribution lines that couple main pads and sub pads are omitted in FIGS. 7A to 7C.

Referring to FIG. 7A, a semiconductor memory device may include four chip regions 10. A main pad region MP may be configured, at a center portion of an internal region that is surrounded by a sealing region SEAL, to have a shape extending in the second direction SD. Two chip regions 10 may be disposed in the first direction FD on each of both sides of the main pad region MP in the first direction FD.

Each chip region 10 may include four planes (Plane). A sub pad region SP may be configured at a center portion of a chip region 10 to have a shape extending in the second direction SD. Two planes (Plane) may be disposed on both sides of the sub pad region SP in the first direction FD. The planes (Plane) on one side of the sub pad region SP may be disposed in the second direction SD. For example, the four planes in a chip region may be arranged in two rows and two columns, with the sub pad region SP arranged between the columns.

All of the chip regions 10 included in the semiconductor memory device may have substantially the same structure. In this example, the sub pad layout structures of all of the chip regions 10 may be the same.

The chip regions 10 included in the semiconductor memory device do not necessarily need to have the same structure. As another example, some of the chip regions 10 may have a structure symmetrical to the other chip regions. In this case, the sub pad layout structure of some chip regions 10 and the sub pad layout structure of the other chip regions 10 may be symmetrical to each other.

For example, in FIG. 7B, chip regions 10 positioned on a left side of a main pad region MP and chip regions 10 positioned on a right side of the main pad region MP may be symmetrical to each other across the main pad region MP. Sub pads 11 of the chip regions 10 positioned on the left side of the main pad region MP and sub pads 11 of the chip regions 10 positioned on the right side of the main pad region MP may be positioned on opposite sides of a virtual line L-L' extending in the first direction FD.

Referring to FIG. 7C, sub pad regions SP may be disposed outside chip regions 10, and chip regions 10 that are disposed on both sides of each sub pad region SP in the first direction FD may be coupled in common to the one sub pad region SP and share the one sub pad region SP.

The semiconductor memory device may include a plurality of main pad regions MP. The number of main pad regions MP is less than the number of sub pad regions SP. As an example, FIG. 7C illustrates a case in which the number of main pad regions MP is two and the number of sub pad regions SP is four.

The structures of the semiconductor memory devices illustrated in FIGS. 7A to 7C are for illustration purposes only, and the structure of a semiconductor memory device in accordance with embodiments of the disclosure may be variously changed.

Figure 8:
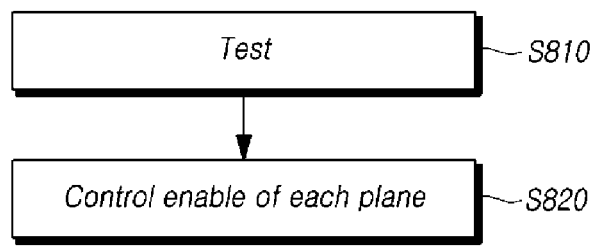
FIG. 8 is a flow chart illustrating a partial rescue method of a semiconductor memory device in accordance with an embodiment of the disclosure.

FIG. 8 is a flow chart illustrating a partial rescue method of a semiconductor memory device in accordance with an embodiment of the disclosure.

Referring to FIGS. 1 and 8, first, in a test mode, as a plurality of planes (Plane) are individually tested, the status signal (Plane Status) for each plane indicating whether a failure exists or not in each of the planes (Plane) may be obtained (S810).

At a step S810, a rescue circuit 211 may independently enable a plurality of planes (Plane) in response to plane enable signals inputted through plane enable pads, respectively. Thus, each of the plurality of planes (Plane) may be tested for the existence or absence of a failure. The status signal (Plane Status) for each plane, each of which is obtained through a test, may be stored in the plane status storage unit 212.

Based on the status signal (Plane Status) for each plane, each plane may be controlled such that a failed plane (Plane) is disabled. In a step S820, only the remaining normal planes (Plane) are enabled.

At the step S820, an address is applied from the outside.

Thereafter, the rescue circuit 211 may discriminate, based on the status signal (Plane Status) for each plane stored in the plane status storage unit 212, whether a plane (Plane) corresponding to the received address is in a normal state or a failed state. If the plane (Plane) corresponding to the received address is normal, then the rescue circuit 211 may enable the corresponding plane (Plane). If the plane (Plane) corresponding to the received address is failed, then the rescue circuit 211 may disable the corresponding plane (Plane), and may enable another normal plane (Plane) instead of the failed corresponding plane (Plane).

In this way, according to embodiments of the disclosure, if a plane (Plane) corresponding to an address applied from the outside is a failed plane, then the corresponding plane (Plane) may be disabled so that a failed plane (Plane) is suppressed from being accessed, and thereby, an operation may be performed with only the remaining normal planes (Plane). Therefore, even when some planes (Plane) are failed, the remaining normal planes (Plane) may be rescued, and thereby, a semiconductor memory device with reduced memory capacity may be configured. Semiconductor memory devices rescued in this way may be mass-produced as partially rescued semiconductor memory devices.

For example, in a 128 Gb*2-plane*2-chip structure, as illustrated in FIG. 5, in the case where two planes are checked as being failed, the semiconductor memory device may be mass-produced according to a product specification with capacity reduced to half through the partial rescue.

Part (a) of FIG. 9 is an exemplary top view illustrating a semiconductor memory device that is different from the embodiments of the disclosure, and part (b) of FIG. 9 is an exemplary top view illustrating a semiconductor memory device in accordance with an embodiment of the disclosure.

Referring to part (a) of FIG. 9, a main pad region MP and a sealing region SEAL may be provided for each chip region 10. For example, two main pad regions MP corresponding to two chip regions 10, respectively, may be provided, and two sealing regions SEAL may be provided each to surround one chip region 10 and one main pad region MP.

Referring to part (b) of FIG. 9, according to an embodiment of the disclosure, one main pad region MP and one sealing region SEAL may be provided for a plurality of chip regions 10. Due to this fact, as compared to the case of part (a) of FIG. 9, an area consumed by the main pad region MP and the sealing region SEAL may be reduced, and thus, the semiconductor memory device may be configured to a small size.

Of course, according to embodiments of the disclosure, although there is a factor that causes an increase in size due to the addition of sub pad regions SP, because a sub pad 11 has a size smaller than a main pad 20 as described above with reference to FIG. 5, it is possible to configure the sub pad region SP with a smaller area than the main pad region MP. Therefore, even considering that the size of the semiconductor memory device slightly increases due to the sub pad regions SP, the effect of reducing the overall size of the semiconductor memory device according to the disclosure is still effective. By comparing part (a) of FIG. 9 and part (b) of FIG. 9, it may be seen that an embodiment of the disclosure (part (b) of FIG. 9) has a width smaller by a width H than the comparative example (part (a) of FIG. 9). Therefore, the size of the device in part (b) is smaller than the size of the device in part (a) by a size corresponding to the width H.

FIG. 10 is a block diagram schematically illustrating a memory system including a semiconductor memory device in accordance with an embodiment of the disclosure.

Referring to FIG. 10, a memory system 600 in accordance with an embodiment may include a nonvolatile memory device (VNM Device) 610 and a memory controller 620.

The nonvolatile memory device (VNM Device) 610 may be constituted by a semiconductor memory device described above and may operate in the manner described above. The memory controller 620 may be configured to control the nonvolatile memory device (VNM Device) 610. By the combination of the nonvolatile memory device (VNM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (VNM Device) 610.

A memory interface (Memory I/F) 625 interfaces with the nonvolatile memory device (VNM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (VNM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

FIG. 11 is a block diagram schematically illustrating a computing system including a semiconductor memory device in accordance with an embodiment of the disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A layout of a semiconductor memory device comprising:
    a plurality of chip regions each including a plurality of planes arranged in a first direction;
    a main pad region extending in a second direction perpendicular to the first direction and including a plurality of main pads arranged in the second direction;
    a plurality of sub pad regions, each extending in the second direction and including a plurality of sub pads arranged in the second direction;
    wherein each of the plurality of planes corresponds to one of the plurality of main pads;
    wherein each of the plurality of planes is directly connected to at least one of the plurality of sub pads, which is connected to the corresponding one of the main pads through a redistribution line; and
    wherein a width of the main pad region in the first direction is greater than a width of the sub pad region in the first direction.

2. The layout of a semiconductor memory device of claim 1, wherein the plurality of chip regions, the main pad region and the sub pad region are disposed within a region surrounded by a sealing region.

3. The layout of a semiconductor memory device of claim 1, wherein each of the plurality of sub pad regions corresponds to at least two of the plurality of planes arranged on both sides of the sub pad region in the first direction.

4. The layout of a semiconductor memory device of claim 1, wherein the main pad region is disposed an edge, in the first direction, of the region surrounded by the sealing region, and the plurality of main pads are arranged in the second direction along the edge.

5. The layout of a semiconductor memory device of claim 2, wherein the main pad region is disposed in the center of the region surrounded by the sealing region, and the plurality of chip regions and the plurality of sub pad regions on opposite sides of the main pad region are symmetrical.

6. The layout of a semiconductor memory device of claim 1, further comprising a rescue circuit configured to disable a failed plane and enable a normal plane from among the plurality of planes based on a corresponding status signal stored in a plane status storage unit,
    wherein the plurality of chip regions are coupled to each other through a scribe lane.

7. The layout of a semiconductor memory device of claim 6, wherein the plurality of planes are disposed on a cell wafer and the rescue circuit and plane status storage unit are disposed on a peripheral wafer.

8. The layout of a semiconductor memory device of claim 6, wherein the semiconductor memory device operates with some normal planes enabled and with the other failed planes disabled, among the plurality of planes.

9. The layout of a semiconductor memory device of claim 1,
    wherein the plurality of main pads are bonding pads to which a plurality of external coupling members are bonded, and wherein the plurality of sub pads are non-bonding pads that are not bonded to external coupling members.

\* \* \* \* \*